United States Patent
Aronson

(10) Patent No.: US 7,065,106 B2
(45) Date of Patent: Jun. 20, 2006

(54) TRANSMITTER OPTICAL SUB-ASSEMBLY WITH EYE SAFETY

(75) Inventor: Lewis B. Aronson, Los Altos, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/070,756

(22) Filed: Mar. 2, 2005

(65) Prior Publication Data

US 2005/0195865 A1    Sep. 8, 2005

Related U.S. Application Data

(60) Provisional application No. 60/549,626, filed on Mar. 3, 2004.

(51) Int. Cl.
*H01S 3/10* (2006.01)

(52) U.S. Cl. .......................... 372/9; 372/75; 372/109; 385/92; 385/14; 385/31

(58) Field of Classification Search ............... 372/9, 372/75, 109; 385/14, 92, 31
See application file for complete search history.

(56) References Cited

U.S. PATENT DOCUMENTS

| | | | |
|---|---|---|---|
| 5,741,442 A | | 4/1998 | McBranch et al. |
| 6,757,308 B1* | | 6/2004 | Eldring et al. ............. 372/36 |
| 6,888,169 B1* | | 5/2005 | Malone et al. ............. 257/82 |
| 2001/0030789 A1* | | 10/2001 | Jiang et al. ............. 359/152 |
| 2002/0076148 A1 | | 6/2002 | DeRosa et al. |
| 2003/0085054 A1* | | 5/2003 | Ames et al. ............. 174/254 |
| 2003/0156607 A1* | | 8/2003 | Lipson et al. ............. 372/36 |
| 2003/0236019 A1* | | 12/2003 | Hanley et al. ............. 439/372 |
| 2004/0101258 A1* | | 5/2004 | Aronson et al. ............. 385/92 |
| 2004/1010258 | | 5/2004 | Aronson et al. |
| 2004/0247242 A1 | | 12/2004 | Blasingame et al. |
| 2005/0013547 A1* | | 1/2005 | Rossi et al. ............. 385/53 |

OTHER PUBLICATIONS

"Optical Power Limiter Series 86580", Kilolambda product datasheet, 2003. http://www.kilolambda.com/docs/LIMITER Preliminary Brochure V5.pdf.
IEC 60825-2 "Safety of laser products—Part 2: Safety of optical fibre communication systems (OFCS)." Edition 3.0, Jun. 28, 2004.

* cited by examiner

*Primary Examiner*—Minsun Oh Harvey
*Assistant Examiner*—Delma R. Flores-Ruiz
(74) *Attorney, Agent, or Firm*—Workman Nydegger

(57) ABSTRACT

A transmitter optical subassembly includes an optical emitter and a fiber receptacle within which an optical fiber is received. An optical limiting element is positioned between the optical emitter and the fiber receptacle. When an optical signal is emitted from the optical emitter, the optical signal passes through the optical limiting element before the optical signal reaches the fiber receptacle and is received by the optical fiber. The optical limiting element has a property such that if the power of the optical signal entering the optical limiting element exceeds a predetermined limit, the power of the optical signal is optically attenuated so that the power of the optical signal exiting the optical limiting element remains below a predetermined limit.

22 Claims, 3 Drawing Sheets

TRANSMITTER OPTICAL SUB-ASSEMBLY WITH EYE SAFETY

CROSS REFERENCE TO RELATED APPLICATIONS

This application claims priority to U.S. Provisional Patent Application No. 60/549,626 filed Mar. 3, 2004 and entitled "Transmitter Optical Sub-Assembly Incorporating Optical Limiting Materials for Eye Safety," which is incorporated herein in its entirety by this reference.

BACKGROUND OF THE INVENTION

1. The Field of the Invention

The present invention relates generally to the field of optical transceivers. More particularly, embodiments of the present invention relate to eye safety requirements for optical signals transmitted from optical transceivers.

2. Related Technology

Laser signals are widely employed in a variety of different technologies and applications. For example, lasers have been widely used in military contexts as range finders, as target designators, and in guidance systems. Lasers are also widely incorporated into communication systems for high-speed data transfer. The practical uses of lasers, as well as the physical properties of different lasers, vary greatly. While some lasers emit relatively low power signals, other lasers may emit signals of much higher power. In many instances, sensitive equipment, as well as human eyes, may be severely damaged by exposure to high power laser signals.

In order to protect human eyes from damaging laser signals, eye safety requirements have been developed to guide manufacturers of optical transmission devices. One set of eye safety requirements, Class 1 eye safety requirements, provide guidelines for safely transmitting laser signals in environments where unprotected eyes may be exposed to those laser signals. Class 1 eye safety limits incorporate limits on laser power and exposure time. Thus, the power of a laser signal may be high for a short period of time, or lower for a long period of time, and still conform to Class 1 eye safety requirements.

Class 1 eye safety requirements apply to the emission of laser signals in applications such as optical transceivers. For fiber optic transceivers, Class 1 eye safety requirements apply under all conditions, including all reasonable single fault conditions, which are defined as reasonable failures of a single component or connection within a transceiver. In order to comply with eye safety requirements, transceivers are generally designed to ensure eye safety in one of two ways. First, the transceiver may be fundamentally safe because the maximum power the transceiver can emit may be less that the eye safety limit. This is often the case with transceivers incorporating longer wavelength lasers that operate in the range of 1310–1550 nm. Second, for cases where the laser signal emitted from the transceiver may not be fundamentally safe, as, for example, with transceivers using lasers which transmit signals with wavelengths in the 850 nm range, the eye safety limit is ensured by redundant electrical circuits that monitor either the laser current, or, more directly, monitor the laser output power through a monitor photodiode.

While eye safety systems based on electrical circuitry are useful for keeping the power of laser signals within the eye safety limits, such eye safety systems may become complex and can increase cost, complicate production, and affect performance of optical transceivers. Eye safety systems based on electrical circuitry include redundancies to ensure that the optical transceiver will continue to function in the event of the failure of a single electrical component or connection within the electrical circuitry used in the transceiver. These electrical circuitry systems generally serve to cut off the bias current to the laser when a fault is detected, and therefore often consist of two transistors in series with the laser element. However, because the series components can reduce the electrical headroom within transceivers, thereby limiting transceiver performance, configuring transistors in series within transceivers may be impractical and inefficient.

Another example of redundant circuitry used to detect or compensate for single point failures involves the use of monitor photodiodes. In an eye safety system incorporating a monitor photodiode, the output of the monitor photodiode is monitored, and when the output exceeds a preset level, the laser bias current is restricted. In such an eye safety system, failure of either the monitor photodiode or the connection to the monitor photodiode must be detected because many systems use the monitor photodiode in a feedback loop to maintain the optical output power in a desired range. If the monitor photodiode, or the connection to the monitor photodiode, fails, the feedback loop will tend to drive the bias current to the maximum level, which in many systems would cause the output power level to exceed eye safety limits. Thus, a redundant system is needed to detect failures of the monitor photodiode, or the circuitry connection to the monitor photodiode, and shut down the laser independently. If all possible failure modes are to be addressed, the total eye safety circuitry can become complex, inefficient, and expensive. Moreover, it is possible to find reasonable single fault failures which will not be detected by a typical eye safety circuit.

Furthermore, design of shortwave optical transceivers is often complicated by the fact that the desired normal operating power is often quite close to the eye safety limit, thereby making design of a system to reliably distinguish between normal and unsafe levels challenging. In fact, the standards for acceptable output power are often defined by a minimum value and a maximum which corresponds to the eye safety limit. The desire to have the largest output power range for high manufacturing yield tends to make the problem of eye safety control more difficult.

SUMMARY OF AN EXEMPLARY EMBODIMENT OF THE INVENTION

These and other problems relating to controlling high-powered optical signals are overcome by embodiments of the present invention which are generally directed to incorporation of an optical limiting material into a transmitter optical subassembly (TOSA) in order to control the optical signal output power and facilitate conformance with eye safety requirements. One such TOSA includes an optical emitter and a fiber receptacle that receives an optical fiber. In order to limit the optical output and thereby facilitate eye safety standard compliance, an optical limiting material is positioned between the optical emitter and the fiber receptacle. An optical limiting material that will limit power to the appropriate level without materially affecting output power under normal conditions is selected. When the optical signal is transmitted from the optical emitter to the optical fiber received into the fiber receptacle, the optical limiting material attenuates any signal with a power that exceeds eye safety requirements.

BRIEF DESCRIPTION OF THE DRAWINGS

To further clarify the above and other aspects of embodiments of the present invention, a more particular description of the invention will be rendered by reference to specific embodiments thereof which are illustrated in the appended drawings. These drawings depict only typical embodiments of the invention and are therefore not to be considered limiting of its scope. In addition, the drawings are not drawn to scale. The invention will be described and explained with additional specificity and detail through the use of the accompanying drawings in which.

DETAILED DESCRIPTION OF EXEMPLARY EMBODIMENTS

Exemplary embodiments of the present invention are concerned with optical transceivers that meet the relevant eye safety requirements by incorporating materials known as optical limiting materials into the design of transmitter optical subassemblies ("TOSA"s). Optical limiting elements composed of optical limiting materials serve to optically attenuate an optical signal when the optical signal power level exceeds a predetermined threshold.

In an exemplary TOSA, a signal is transmitted from the optical emitter, and the signal travels to a fiber receptacle where the optical signal is received by an optical fiber. In order to ensure that the power of the optical signal received into the optical fiber from the optical emitter does not exceed a predetermined limit, such as an eye safety limit, embodiments of the present invention include one or more optical limiting elements between the optical emitter and the optical fiber. The optical limiting elements effectively limit the power of the transmitted optical signal by attenuating an optical signal having a power level above a desired threshold. By limiting the power of optical signals transmitted from the TOSA, optical limiting materials ensure that optical signals transmitted from the TOSA do not exceed eye safety limits and damage unprotected eyes.

I. Exemplary Operating Environments

Figure 1:
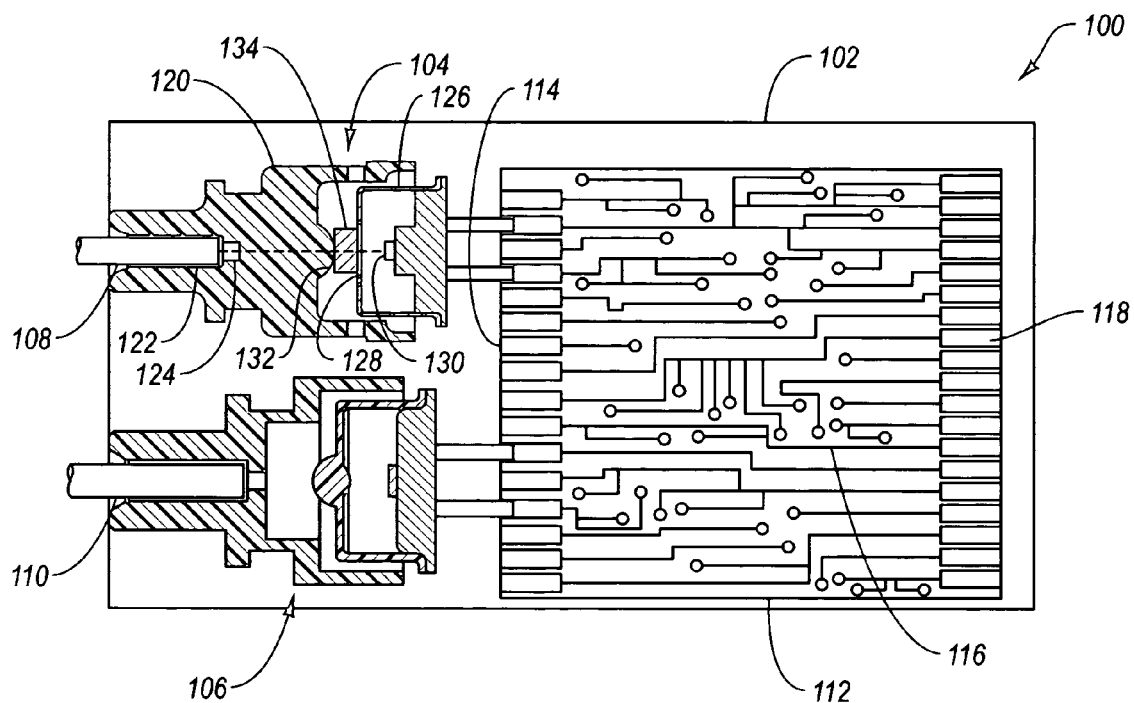
FIG. 1 is a cutaway view of an exemplary optical transceiver module wherein optical limiting materials and elements are employed.

With reference now to FIG. 1, an exemplary optical transceiver module 100 is shown. In addition to a housing 102, transceiver module 100 includes TOSA 104 and receiver optical subassembly (ROSA) 106 substantially enclosed within housing 102. TOSA 104 receives optical fiber 108 while ROSA 106 receives optical fiber 110. Each of TOSA 104 and ROSA 106 connects to printed circuit board (PCB) 112 through first electrical contact elements 114 of the PCB 112. First electrical contact elements 114 connect to signal traces 116 and circuitry of PCB 112 (not shown), where such circuitry may include a post-amplifier, laser driver, and related circuits, and the signal traces then connect with second electrical contact elements 118. Second electrical contact elements 118 connect to external and/or internal electrical components (not shown).

Optical transceiver module 100 receives and transmits optical signals. When an optical signal is received into optical transceiver module 100, the optical signal enters ROSA 106 through optical fiber 110. After entering ROSA 106, the optical signal is converted from an optical signal to an electrical signal. The electrical signal is transmitted from ROSA 106 to PCB 112 through first electrical contact elements 114. The electrical signal then travels through signal traces 116 and circuitry of PCB 112 to second electrical contact elements 118, and then on to external and/or internal electrical components.

In addition to receiving electrical signals from ROSA 106, external and/or internal electrical components may transmit electrical signals to TOSA 104. In one example, an electrical signal is transmitted from external components to second electrical contact elements 118 and travels through PCB 112 along signal traces 116 that are connected with circuitry such as a laser driver for example. Ultimately, the electrical signal, which may be processed by the circuitry, reaches TOSA 104 where the electrical signal is converted to an optical signal. The optical signal is then transmitted from TOSA 104 through optical fiber 108.

With more particular attention now to exemplary TOSA 104, TOSA 104 includes housing 120. In one embodiment of the invention, housing 120 is implemented as a single molded plastic element. Housing 120 may also be configured of alternative materials such as glass, for example. In addition, housing 120 defines fiber receptacle 122 that receives optical fiber 108. A fiber stop 124 located at the end of fiber receptacle 122 serves to limit the distance to which optical fiber 108 can be inserted into the housing 120 of TOSA 104.

The housing 120 of the TOSA 104 is further configured to engage an enclosure 126. The enclosure 126 is exemplarily implemented as a TO can and includes a window 128. An optical emitter 130 is hermetically sealed by the enclosure 126 and is positioned within the enclosure 126 so that optical signals from the optical emitter 130 pass through the window 128.

In one embodiment, the optical emitter 128 is a laser, examples of which include, but are not limited to, vertical cavity surface-emitting lasers ("VCSEL"), Fabry-Perot ("FP") lasers and distributed feedback ("DFB") lasers. The laser or other optical emitter employed in the TOSA 104 may be selected to generate optical signals at a particular desired wavelength. In one exemplary embodiment, the laser emits optical signals having wavelengths of about 850 nm. In other exemplary embodiments, the laser emit optical signal having wavelengths of about 1310 nm, or about 1550 nm.

With continuing attention to FIG. 1, a lens 132 is positioned within TOSA 104 to focus an optical signal from optical emitter 128 into optical fiber 108. Additionally, an optical limiting element 134 is positioned within TOSA 104 between optical fiber 108 and optical emitter 128. One or more optical limiting element(s) 134 may be positioned at any location, or at multiple locations, between optical fiber 108 and optical emitter 128. In the particular example of FIG. 1, the optical limiting element 134 positioned on window 130 of enclosure 126.

Various materials may be used in the construction of optical limiting elements such as optical limiting element 134. Examples of such material include, but are not limited to, glass, transparent glass gels, polymers, and semiconducting polymers blended with materials having non-linear optical properties such as, for example, fillerenes. In other embodiments of the invention, the optical limiting element may be constructed with a polymer, or a polymer mixed with a dopant.

In operation, when an electrical signal is received by TOSA 104 from PCB 112, the electrical signal is converted to an optical signal which is then emitted from optical emitter 128. The optical signal travels from optical emitter 128 through window 130 of enclosure 126 to optical limiting element 134. If the power of the optical signal transmitted to optical limiting element 134 is below a predetermined limit, the optical signal remains substantially unchanged as the optical signal travels through optical limiting element 134. If, however, the power of the optical signal is above a predetermined limit, the optical limiting element 134 optically attenuates the power of the optical signal. Thus, the optical limiting element ensures that the power of the optical signal transmitted from TOSA 104 does not exceed a predetermined limit. In one embodiment of the invention, the predetermined limit corresponds to eye safety requirements. In one embodiment of the invention the eye safety requirements are Class 1 eye safety requirements.

Optical limiting materials may also be incorporated into ROSA 106 located within transceiver 100. Incorporation of optical limiting materials into a ROSA is disclosed in U.S. patent application Ser. No. 11/070,872, entitled "Receiver Optical Sub-assembly With Optical Limiting Materials" filed the same day as the present application and incorporated herein in its entirety by this reference.

II. Exemplary TOSAs with Optical Limiting Materials

Figure 2:
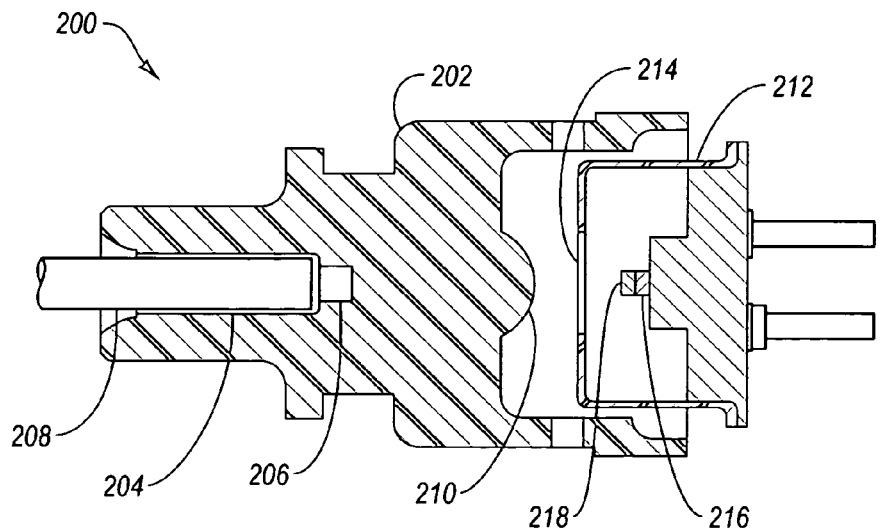
FIG. 2 is a cutaway view of an embodiment of a TOSA with an optical limiting material bonded directly to the emitting surface of the optical emitter.

Directing attention now to FIG. 2, an exemplary TOSA 200 is shown. TOSA 200 includes housing 202 which defines fiber receptacle 204 and an associated fiber stop 206. An optical fiber 208 is received into fiber receptacle 204 and extends to fiber stop 206. The housing 202 also includes an integral lens 210 and is configured to attach to enclosure 212. A window 214 of enclosure 212 is positioned so that an optical emitter 216 hermetically sealed within enclosure 212 is able to transmit optical signals through the window 214 and into the optical fiber 208.

The TOSA 200 also includes optical limiting element 218 located, in this exemplary embodiment, on the emitting surface of optical emitter 216. In general, the optical limiting element serves to attenuate, if necessary, the power of optical signals from optical emitter 216.

Although the optical limiting element 218 shown in FIG. 2 is placed directly on the emitting surface of optical emitter 216, in other exemplary embodiments, the optical limiting element may be placed at any position, or at multiple positions, between optical emitter 216 and fiber receptacle 204. Furthermore, optical limiting materials may be incorporated into other components of the TOSA 200, such as, for example, the lens 210 and/or the fiber stop 208.

Although some exemplary embodiments provide for the use of a discrete optical limiting element, such as optical limiting element 218 for example, the optical limiting functionality associated with the TOSA can be implemented in other ways as well. For example, an alternative embodiment of the TOSA includes a housing, or portion thereof, configured of a material which is doped with an optical limiter compound, such as, for example, a two-photon absorption dye. Any other suitable doping materials may alternatively be employed however. In such an exemplary embodiment, the housing is configured so that an optical signal emitted from an optical emitter passes through a portion of the housing before entering the optical fiber. In this exemplary implementation then, no separate optical limiting element is provided, and the optical limiting functionality is implemented by the TOSA housing itself. One example of such an implementation is similar in configuration to TOSA 200 disclosed in FIG. 2, except that no separate optical limiting element 218 is provided.

III. Exemplary Optical Limiting Materials

As is evident from this disclosure, the disclosed optical limiting elements are exemplary structural embodiments of a means for optically attenuating the power of an optical signal. However, the scope of the invention is not limited to the exemplary types and arrangements of the exemplary optical limiting materials disclosed herein. Rather, any other structure(s) of comparable functionality may likewise be employed.

As suggested earlier herein, optical limiting materials are materials having non-linear optical properties, for at least some optical power ranges, whereby transmissivity through the optical limiting material is relatively high for low powered optical signals and transmissivity decreases to a relatively low level if the power of the optical signal exceeds a predetermined upper limit. In general, the optical limiting material absorbs, if necessary, a portion of the energy of the optical signal that enters the optical limiting material. In this way, the power of optical signals that exit the optical limiting material is kept at or below a predetermined limit.

As suggested elsewhere herein, optical limiting materials have characteristic response times for attenuating optical signals that exceed a given power threshold. As discussed below, the particular desired response time may vary from one application and/or device to another.

The response time of a particular optical limiting material is closely tied to standards, such as eye safety requirements, that provide guidelines for the permissible power level of an optical signal, as well as for the permissible maximum time that an eye may be exposed to the optical signal. In particular, the response time of an optical limiting material is related to the permissible time that an eye can be exposed, without harm, to an optical signal having a certain power. The response time varies from one optical limiting material to another and is typically selected with reference to eye safety standards, for example, and the anticipated power of the optical signals that will be involved. Exemplary response times are measured in time lengths anywhere from hundreds of seconds to micro-seconds.

In one exemplary embodiment, the response time of the optical limiting material is in the range of about 100 μs to about 100 ms. Because eye safety levels are a function of the total time the eye is exposed to a given power level, time limits for exposure to relatively low powered optical signals may be significantly higher than time limits for exposure to relatively high powered optical signals. In addition, if an optical limiting material is able to respond to a relatively high-powered optical signal relatively quickly, the output power of the optical signal could remain relatively high for a relatively longer period of time without exceeding eye safety limits.

Another parameter of optical limiting materials relates to the effect, on the optical limiting materials, of optical signals whose power is above a predetermined limit. In particular, the response of optical limiting materials to optical signals transmitted by the optical emitter of the TOSA may be reversible or irreversible. Although high powered optical signals are attenuated by both reversible and irreversible optical limiting materials, the transmissivity of the reversible optical limiting materials returns to relatively high levels when the power of the optical signal decreases below the predetermined power limit. In contrast, irreversible optical limiting materials are unable to return to high levels of optical signal transmissivity once an optical signal exceeds the power threshold.

Reversible optical materials can further be divided into at least two categories. Materials in the first category are largely absorptive, and may also be known as two-photon absorption materials. Materials in the second category are largely refractive. Although refractive optical limiting materials are suitable for use in optical systems having a strongly converging or diverging optical beam, refractive and/or absorptive optical limiting materials are useful in exemplary embodiments of the present invention.

As noted above, an optical limiting material is selected for use in exemplary embodiments of the invention based on specific properties of the optical limiting material, examples of which include response time, transmissivity and reversibility. Another consideration in the selection of a particular optical limiting material and/or arrangement of optical limiting material relates to the wavelength(s) of the associated optical signal.

For example, if the wavelength of the optical signal emitted by the laser of the TOSA is about 850 nm, an optical limiting material having a limiting power in the range of about −3 dBm to about −1.3 dBm could be selected to provide the desired optical attenuation functionality. The upper bound of the optical signal power that can be transmitted through such an optical limiting material, and the maximum eye safety limit for optical signal power, is about −2 dBm. These power limits refer to the power of the optical signal received at the optical fiber. Of course, such power limits are exemplary only and are not intended to limit the scope of the invention.

The optical limiting material may be selected for use with optical signals of other wavelengths as well. For example, some embodiments of the invention employ lasers that emit signals of 1310 nm, and 1550 nm, respectively. This wavelength information would thus inform the selection of particular optical limiting material(s). In this particular example, response times for optical limiting materials selected for use in TOSAs transmitting signals in at 1310 nm or 1550 nm can be relatively longer than response times for optical limiting materials selected for use in TOSAs transmitting signals in the 850 nm range, without exceeding eye safety requirements. Thus, embodiments of the invention employ a variety of different optical emitters, transmitting at various wavelengths.

As the foregoing makes clear, various parameters concerning the optical limiting materials may be adjusted as necessary to suit a particular application. Examples of such parameters include, but are not limited to, transmissivity, reversibility, response time, range of limiting power, positioning of the optical limiting materials, wavelength of the optical emitter, and energy absorption.

IV. Performance of Optical Limiting Materials

Figure 3:
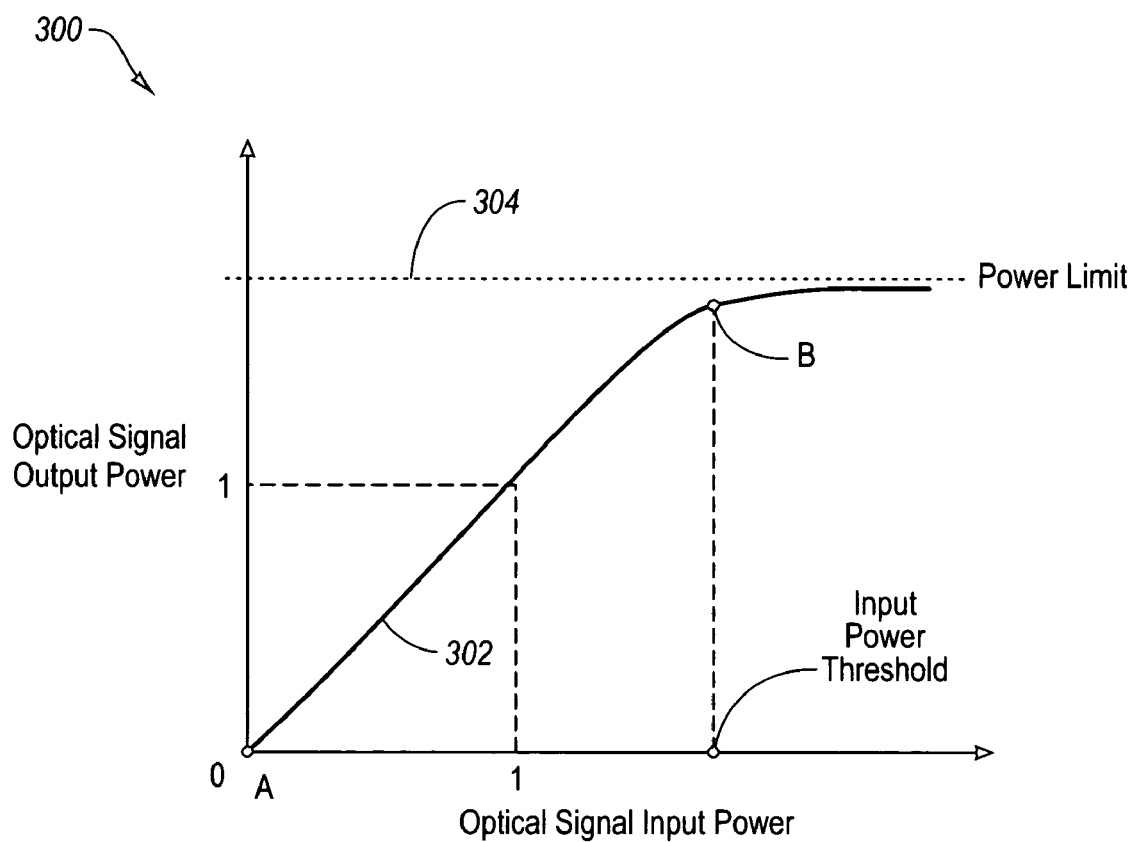
FIG. 3 is a graph of the output power of an optical signal transmitted from an optical limiting material as a function of the input power of an optical signal entering the optical limiting material.

With attention now to FIG. 3, a graphical representation of output power from the optical limiting material as a function of the input power to the optical limiting material shows the optical limiting properties of optical limiting materials. Optical limiting materials used in exemplary embodiments of the present invention are selected so that the transmissivity of the optical limiting material corresponds with a specified power threshold, as shown in FIG. 3 by line 302. In one embodiment of the invention, the power threshold is the damage threshold of the detector element.

In another embodiment of the invention, the power threshold is the optical overload limit of the detector element. When the input power of the optical signal received into the optical limiting material is below the power threshold, as shown by line AB, the output power is substantially equal to the input power. Thus, the transmissivity through the optical limiting material is approximately 100%. As the input power reaches an input power threshold, indicated at point "B," that corresponds with an output power that is a predetermined level below the power threshold, line 304, the optical limiting material attenuates the power of the optical signal, thereby preventing the power of the output optical signal from exceeding the power threshold, notwithstanding any further increase in the input power beyond the input power threshold "B."

That is, increases in the input power to the optical limiting material beyond point "B" do not result in significant changes in the output power from the optical limiting material, due to the attenuation properties of the optical limiting material. Correspondingly, the transmissivity response of the optical limiting material flattens and may approach zero for increases in input optical power beyond the input power threshold. In embodiments of the invention where the optical limiting material is reversible, the transmissivity of the optical signal returns to a level near 100% when the input power of the optical signal drops below the input power threshold indicated at "B."

V. Method for Optical Attenuation

Figure 4:
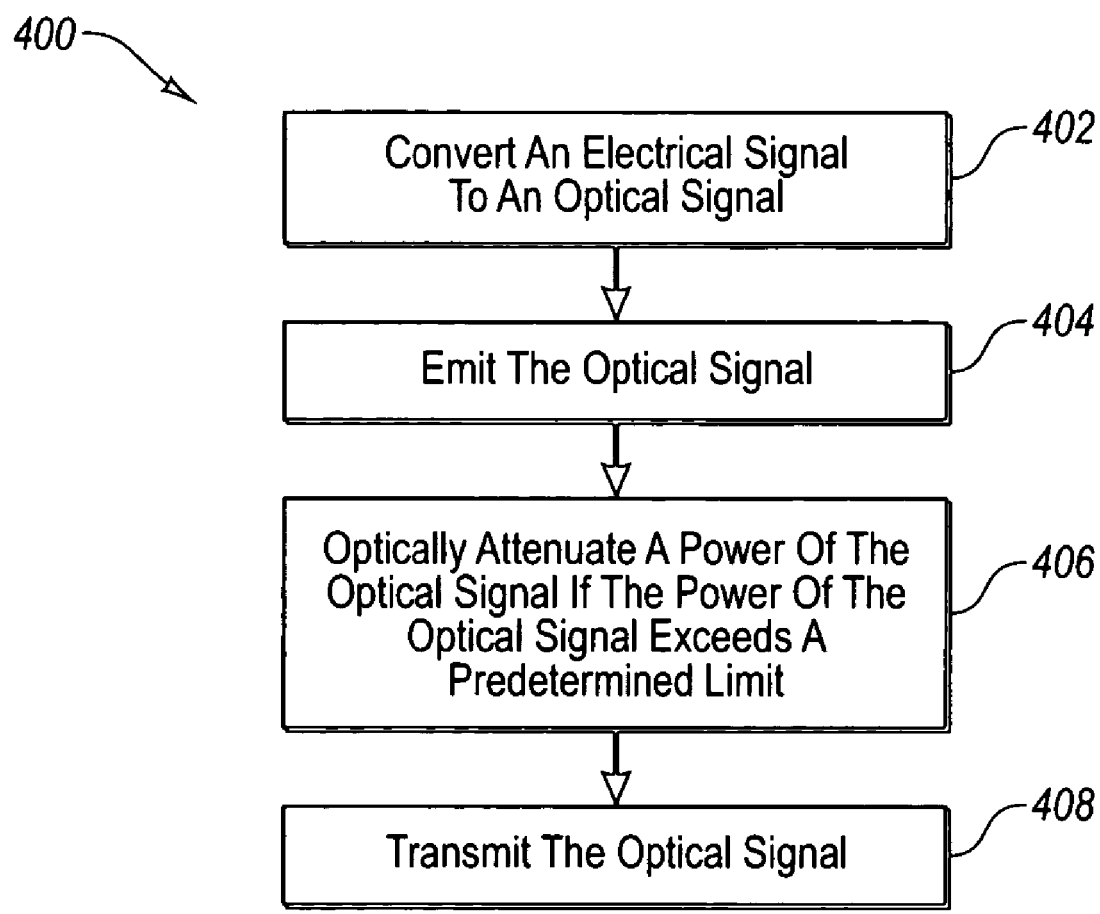
FIG. 4 is a flow diagram showing a process for limiting the power of an optical signal transmitted in a TOSA.

With attention now to FIG. 4, a method for processing an optical signal within a TOSA is shown. At stage 402 an electrical signal is converted to an optical signal. The optical signal is then emitted, by a laser for example, as shown at stage 404. If the input power of the optical signal exceeds the input power threshold, the power of the optical signal is optically attenuated, as shown at stage 406 so that the power of the output optical signal remains below a predefined power limit. At stage 408, the attenuated optical signal is transmitted. The power of the optical signal transmitted is thereby maintained at a power below the eye safety limit, or at some other predetermined threshold.

Embodiments of the present invention maintain optical signal output power levels within a desired limit by incorporating optical limiting materials into components such as TOSAs. By placing an optical limiting material between an optical emitter, such as a laser, and an optical fiber, the power of the optical signal which is ultimately transmitted into the optical fiber is prevented from exceeding a desired limit.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A transmitter optical subassembly comprising:
   an enclosure within which an optical emitter is disposed;
   a housing attached to the enclosure and defining a fiber receptacle configured so that when an optical fiber is received in the fiber receptacle, an optical signal from the optical emitter passes into the optical fiber; and
   an optical limiting element positioned between the optical emitter and the fiber receptacle, the optical limiting element having a tranmissivity such that when power of the optical signal entering the optical limiting element falls within a predetermined range, power of the optical signal leaving the optical limiting element remains at or below a predetermined limit and such that when the power of the optical signal exceeds the predetermined range, the transmissivity of the optical limiting element decreases.

2. The transmitter optical subassembly of claim 1, wherein the optical emitter is one of: a vertical cavity surface emitting laser (VCSEL); a Fabry-Perot laser; or, a distributed feedback (DFB) laser and wherein the optical limiting element further comprises a first material blended with a second material, the second material having non-linear optical properties when the optical power exceeds the predetermined range.

3. The transmitter optical subassembly as recited in claim 1, wherein the emission wavelength of the optical emitter is one of: about 850 nm; about 1310 nm; or, about 1550 nm.

4. The transmitter optical subassembly as recited in claim 1, wherein the optical limiting element is one of: absorptive; or, refractive.

5. The transmitter optical subassembly as recited in claim 1, wherein the optical limiting element is located on an emitting surface of the optical emitter.

6. The optical transmitter assembly as recited in claim 1, wherein the optical limiting element is one of: reversible such that the transmissivity returns to a first level of transmissivity when the optical power returns to the predetermined range after exceeding the predetermined range; or irreversible such that the transmissivity does not return to the first level of transmissivity when the optical power returns to the predetermined range after having exceeded the predetermined range.

7. The optical transmitter assembly as recited in claim 1, wherein the predetermined limit is an eye safety limit.

8. The optical transmitter assembly as recited in claim 1, wherein the transmissivity of the optical limiting element is substantially linear in a first range of input optical powers of the optical signal, and substantially non-linear in a second range of input optical powers of the optical signal.

9. The optical transmitter assembly as recited in claim 1, further comprising a lens interposed between the fiber receptacle and the optical emitter.

10. An optical transceiver module comprising:
    a printed circuit board;
    a receiver optical subassembly connected to the printed circuit board;
    a transmitter optical subassembly connected to the printed circuit board, and comprising:
        an optical emitter;
        a fiber receptacle configured so that when an optical fiber is received therein signals from the optical emitter pass into the optical fiber; and
        means for optically attenuating an optical signal that is generated by the optical emitter when an optical power of the optical signal exceeds a predetermined limit, wherein the means for optical attenuating the optical signal transmits the optical signal substantially unchanged when the optical power is at or below the predetermined limit; and
    a housing that substantially encloses the printed circuit board, the transmitter optical subassembly, and the receiver optical subassembly.

11. The optical transceiver module as recited in claim 10, wherein the means for optically attenuating an optical signal comprises one of:
    an optical limiting element having a doped portion; or
    an optical limiting element having a first material blended with a second material, the second material having non-linear optical properties.

12. The optical transceiver module as recited in claim 10, wherein the means for optically attenuating an optical signal comprises an optical limiting element positioned between the fiber receptacle and the optical emitter.

13. The optical transceiver module as recited in claim 10, wherein the means for optically attenuating an optical signal attenuates, as necessary, signals received from the optical emitter so that when power of a received optical signal falls within a predetermined range prior to any attentuation of the received optical signal by the means for optically attenuating an optical signal, the power of the optical signal as the optical signal enters the optical fiber remains at or below a predetermined limit.

14. The optical transceiver module as recited in claim 10, wherein the means for optically attenuating an optical signal absorbs optical power from a received signal if the optical power of the received signal exceeds the predetermined limit.

15. The optical transceiver module as recited in claim 10, wherein the means for optically attenuating an optical signal begins limiting optical power at an input power level in the range of about −6 dBm to about +3 dBm.

16. The optical transceiver module as recited in claim 10, wherein the means for optically attenuating an optical signal operates by one of the following mechanisms: absorption; or, refraction.

17. The optical transceiver module as recited in claim 10, wherein the predetermined limit is one of: an optical overload limit; or, an optical damage threshold.

18. The optical transceiver module as recited in claim 10, wherein the means for optically attenuating is reversible such that a transmissivity of the means for optically attenuating returns to a first level when an optical power of the optical signal returns to a level of optical power that is below the predetermined limit after having exceeded the predetermined limit.

19. A method of processing an optical signal within a transmitter optical subassembly, the method comprising:
    generating an optical signal;
    emitting the optical signal;
    passing the optical signal substantially unchanged with an optical limiting element when an optical power of the optical signal is below a predetermined limit;
    optically attenuating the optical power of the optical signal with the optical limiting element, if the power exceeds the predetermined limit, wherein the optical limiting element includes a material having non-linear optical properties that operate to attenuate the optical power when the optical power exceeds the predetermined limit; and
    transmitting the optical signal.

20. The method as recited in claim 19, wherein the generated optical signal comprises a laser signal having a wavelength of one of: about 850 nm; about 1310 nm; or about 1550 nm.

21. The method as recited in claim 20, wherein when the power of the received optical signal falls within a predetermined range, a power of the transmitted optical signal remains at or below a predetermined limit.

22. The method as recited in claim 20, wherein optical attenuation does not occur until the power of the received optical signal falls within the range of about −6 dBm to about +3 dBm.

* * * * *

UNITED STATES PATENT AND TRADEMARK OFFICE
CERTIFICATE OF CORRECTION

PATENT NO. : 7,065,106 B2  
APPLICATION NO. : 11/070756  
DATED : June 20, 2006  
INVENTOR(S) : Lewis B. Aronson Page 1 of 1

It is certified that error appears in the above-identified patent and that said Letters Patent is hereby corrected as shown below:

<u>Column 5</u>  
Line 54, change "208" to --206--

Signed and Sealed this

Twelfth Day of August, 2008

JON W. DUDAS  
*Director of the United States Patent and Trademark Office*